United States Patent
Pham-Van-Diep et al.

(10) Patent No.: US 6,571,701 B1
(45) Date of Patent: Jun. 3, 2003

(54) STIRRING MECHANISM FOR VISCOUS-MATERIAL PRINTER AND METHOD OF PRINTING

(75) Inventors: Gerald C. Pham-Van-Diep, Hopkinton, MA (US); Patsy Anthony Mattero, Woonsocket, RI (US); Timothy J. Joyce, Hopkinton, MA (US); Eric J. Gray, Pawtucket, RI (US)

(73) Assignee: Speedline Technologies, Inc., Franklin, MA (US)

( * ) Notice: Subject to any disclaimer, the term of this patent is extended or adjusted under 35 U.S.C. 154(b) by 0 days.

(21) Appl. No.: 09/849,699

(22) Filed: May 4, 2001

(51) Int. Cl.[7] .............................. B41L 13/18; B23K 3/06
(52) U.S. Cl. .................... 101/129; 101/114; 101/123; 118/304; 118/406
(58) Field of Search ................................ 101/114, 116, 101/119, 120, 123, 124, 126, 129; 118/301, 406; 228/33; 427/96

(56) References Cited

U.S. PATENT DOCUMENTS

| | | | | |
|---|---|---|---|---|
| 4,442,771 A | * | 4/1984 | Mitter | 101/122 |
| 5,287,806 A | * | 2/1994 | Nanzai | 101/123 |
| 5,579,690 A | * | 12/1996 | Tani et al. | 101/120 |
| 5,746,125 A | * | 5/1998 | Tani | 101/123 |
| 5,925,187 A | | 7/1999 | Freeman et al. | 118/667 |
| 5,947,022 A | | 9/1999 | Freeman et al. | 101/123 |
| 6,045,615 A | * | 4/2000 | Buechele et al. | 118/300 |

FOREIGN PATENT DOCUMENTS

| | | | |
|---|---|---|---|
| JP | 11-58684 | * | 3/1999 |
| JP | 2000-202988 | * | 7/2000 |
| WO | WO 00/43156 | | 7/2000 |

* cited by examiner

*Primary Examiner*—Leslie J. Evanisko
(74) *Attorney, Agent, or Firm*—Mintz, Levin, Cohn, Ferris, Glovsky and Popeo, P.C.

(57) ABSTRACT

A printer includes a dispensing head for dispensing viscous material, such as solder paste. The dispensing head defines a chamber and includes at least one source port and a dispensing slot, wherein the viscous material flows from a supply mounted to the source port, into the chamber and out the dispensing slot. Within the chamber, a stirring mechanism is mounted. The stirring mechanism is coupled to a drive mechanism that displaces the stirring mechanism through the chamber, thereby stirring the viscous material. The stirring mechanism is particularly effective in preventing or reducing compaction of solder paste within the chamber.

24 Claims, 6 Drawing Sheets

STIRRING MECHANISM FOR VISCOUS-MATERIAL PRINTER AND METHOD OF PRINTING

BACKGROUND

In manufacturing surface-mount printed circuit boards, a stencil printer can be used to print solder paste onto the circuit board. Typically, a circuit board having a pattern of pads or some other, usually conductive, surface onto which solder paste will be deposited is automatically fed into the stencil printer; and one or more small holes or marks (known as "fiducials") on the circuit board are used to properly align the circuit board with the stencil or screen of the stencil printer prior to printing solder paste onto the circuit board. In some systems, an optical alignment system is used to align the circuit board with the stencil.

Once the circuit board has been properly aligned with the stencil in the printer, the circuit board is raised to the stencil, solder paste is dispensed onto the stencil, and a wiper blade (or squeegee) traverses the stencil to force the solder paste through apertures in the stencil and onto the board. As the squeegee is moved across the stencil, the solder paste tends to roll in front of the blade, which desirably causes mixing and shearing of the solder paste so as to attain a desired viscosity to facilitate filling of the apertures in the screen or stencil. The solder paste typically is dispensed onto the stencil from a standard cartridge such as that manufactured by Systems Engineering and Management Co. (SEMCO), Vista, Calif., USA.

In some stencil printers, any excess solder paste remaining under the squeegee, after it has fully traversed the stencil, remains on the stencil when the squeegee is returned to its initial position for printing on a second circuit board. In some screen printers, a second squeegee moves across the stencil in the direction opposite to that of the first squeegee. The first squeegee and the second squeegee are used on alternating boards to continually pass the roll of solder paste over the apertures of a stencil to print on each successive circuit board. In the stencil printers that utilize two squeegees, there is still the problem that at the end of a manufacturing day, or when the stencil is to be changed, excess solder paste typically remains on the stencil and must be manually removed. Also, in these known printers, it is difficult to maintain a desirable viscosity because volatile solvents escape from the solder paste, thereby affecting the viscosity of the solder paste.

In the stencil printers discussed above, the squeegee blades are typically at a predetermined angle with respect to the stencil to apply downward pressure on the solder paste to force the solder paste through the apertures in the stencil as the squeegee is moved across the stencil. The angle of the blade is selected based on the speed at which the blade traverses the stencil and based on the desired downward pressure on the solder paste from the blade. It is desirable to maintain a consistent pressure on the solder paste as the squeegee traverses the stencil; however, in a typical printer, the pressure varies due to variations in paste viscosity throughout a production run and due to variations in the angle of the squeegee caused by deformation of the squeegee due to the pressure applied by the squeegee driving device.

Responding to some of the problems, noted above, in previous printing apparatus, an improved solder-paste dispensing head is described in U.S. Pat. No. 5,947,022, wherein a movable dispensing head has a cylindrical chamber including ports to which removable cartridges that supply solder paste are coupled. Solder paste is passed from the removable cartridges, into the cylindrical chamber, then out of a dispensing slot, through a stencil and onto a circuit board in a desired pattern. U.S. Pat. No. 5,947,022 is incorporated herein by reference in its entirety.

Nevertheless, even in this improved solder-paste dispensing system, consistency in the quality and character of the printed solder paste can not always be maintained for all types of solder paste, and consistency in the quality of the finished printed circuit board consequently suffers. Further, the stencil printing process generally is still not understood well enough that it can be reliably engineered to regularly produce acceptable levels of defects in the printed solder.

SUMMARY

The printer of this invention includes a stirring mechanism that can offer a substantial improvement in, and control over, the quality of printed material. The stirring mechanism can be used to preserve and promote the homogeneity of the printed material. When the printer is used for printing solder paste, the stirring mechanism can prevent or reduce compaction of the solder paste during the printing operation. When solder paste "compacts," the flux separates from the solid particles, thereby compromising the quality of the printed solder paste.

More specifically, the printer of this disclosure includes a viscous-material dispensing head that has a chamber through which the viscous material (e.g., solder paste) can be channeled. The chamber includes at least one source port that can be coupled with a source of viscous material, such as a solder-paste cartridge, and a dispensing slot through which the viscous material can exit the chamber and be deposited on a substrate. In operation, the viscous material is directed from the source through the source port and into the chamber; the viscous material then exits the chamber through the dispensing slot.

The stirring mechanism of this invention is mounted within the chamber and is coupled with a drive mechanism that displaces the stirring mechanism through the chamber so as to stir the viscous material within the chamber. In embodiments where the viscous material is solder paste, displacement of the stirring mechanism through the chamber stirs the solder paste to greatly reduce or eliminate compaction of the solder paste, which would otherwise occur.

In one embodiment, the drive mechanism reciprocally displaces the stirring mechanism along a longitudinal axis of the chamber. The chamber can be substantially-cylindrical in shape, with the source port(s) and dispensing slot(s) radially displaced from the longitudinal axis on the side wall of the chamber. In a particular embodiment, the stirring mechanism is an apertured stirring blade mounted on a threaded shaft (i.e., a screw), wherein the stirring blade is displaced along the threaded shaft as the shaft is rotated by a rotary motor or other drive mechanism. As the stirring blade is displaced, viscous material (e.g., solder paste) is displaced through the apertures of the blade and thereby stirred.

The dispensing head can be mounted to a frame, to which a stencil is also mounted. The stencil is positioned between the dispensing slot of the dispensing head and the substrate (e.g., a printed circuit board) on which solder is to be deposited at selected locations.

Another advantage that can be achieved with apparatus and methods of this invention is that the printers can be used to print a broader variety of viscous materials having a broader range of viscosities because the speed of the stirring mechanism can be adjusted to provide as much or as little stirring as is necessary to preserve the homogeneity of a particular viscous material.

BRIEF DESCRIPTION OF THE DRAWINGS

The foregoing and other features and advantages of the invention will be apparent from the following, more-particular description. In the accompanying drawings, like reference characters refer to the same or similar parts throughout the different views. The drawings are not necessarily to scale, emphasis instead being placed upon illustrating particular principles, discussed below.

DETAILED DESCRIPTION

For purposes of illustration, embodiments of the present invention will now be described with reference to a stencil printer used to print solder paste onto a circuit board. One skilled in the art will appreciate, however, that the use of the apparatus described herein is not limited to stencil printers that print solder paste onto circuit boards, but rather, may be used in other applications requiring dispensing of other viscous materials such as glues and encapsulents on a variety of substrates. Also, the terms, "screen" and "stencil," may be used interchangeably herein to describe a device in a printer that defines a pattern to be printed onto a substrate.

Figure 1:
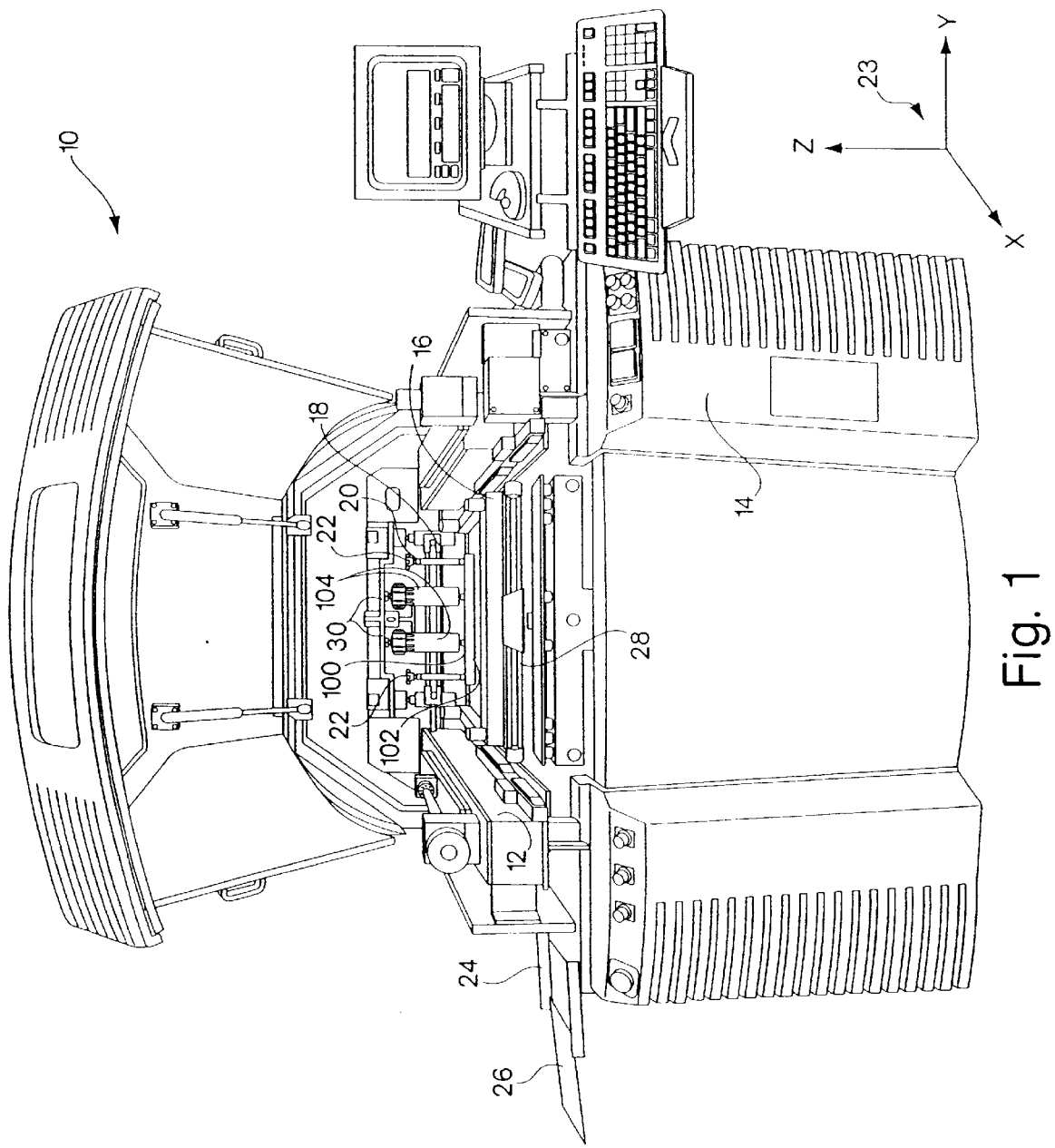
FIG. 1 provides a front view of a stencil printer.

FIG. 1 shows a front view of a stencil printer 10. Stencil printers, such as the ULTRAPRINT 3000 stencil printer and the AP Series stencil printer (both available from MPM Corporation of Franklin, Mass., USA), can readily be adapted for use with embodiments of the present invention. The stencil printer 10 includes a frame 12 that supports components of the stencil printer including a controller 14, a stencil 16, and a dispensing head 100 having a dispensing slot 102 from which solder paste may be dispensed.

The dispensing head 100 is coupled to a first plate 18 using two thumbscrews 22. The first plate 18 is coupled to a second plate 20, which is coupled to the frame 12 of the stencil printer 10. The first plate 18 is coupled to the second plate 20 in such a manner that the first plate 18 can be moved with respect to the second plate 20 along a z-axis, the z-axis being defined by the coordinate axis system 23 shown in FIG. 1. The first plate 18 is moved by motors under the control of the controller 14.

The second plate 20 is movably coupled to the frame 12 such that the second plate 20 can move with respect to the frame 12 along an x-axis, the x-axis also being defined by the coordinate axis system 23. As described below in further detail, the movements of the first and second plates 18, 20 allow the dispensing head 100 to be placed over the stencil 16 and moved across the stencil 16 to allow printing of solder paste onto a circuit board 26.

Stencil printer 10 also includes a conveyor system having rails 24 for transporting a circuit board 26 to a printing position. The stencil printer 10 has a number of pins 28, positioned beneath the circuit board 26 when the circuit board 26 is in the dispensing position. The pins 28 are used to raise the circuit board 26 off of the rails 24 to place the circuit board 26 in contact with, or in close proximity to, the stencil 16 when printing is to occur.

The dispensing head 100 is configured to receive two standard SEMCO three-ounce or six-ounce solder paste cartridges 104 that provide solder paste to the dispensing head during a printing operation. The SEMCO cartridges are available from Systems Engineering & Management Co. (Vista, Calif., USA). Each of the cartridges 104 is coupled to one end of a pneumatic air hose 30. As is readily understood by those skilled in the art, the dispensing head 100 can be adapted to receive other standard, or non-standard, cartridges or other sources of solder paste. The other end of each of the pneumatic air hoses 30 is attached to a compressor that, under the control of the controller 14, provides pressurized air to the cartridges 104 to force solder paste to flow from the cartridges 104 into the dispensing head 100 and onto the screen 16. A mechanical device, such as a piston, may be used in addition to, or in place of, air pressure to force the solder paste from the SEMCO cartridges into the dispensing head.

In one embodiment of the present invention, the controller 14 is implemented using a personal computer using the Microsoft WINDOWS NT operating system with application-specific software to control the operation of the stencil printer, as described herein.

The stencil printer 10 operates as follows. A circuit board 26 is loaded into the stencil printer using the conveyor rails 24. The dispensing head 100 is then lowered in the z-direction until it is in contact with the stencil 16. Pressurized air is provided to the cartridges 104 while the dispensing head 100 is moved in the x-direction across the stencil 16. The pressurized air forces solder paste out of the cartridges 104 and creates pressure on the solder paste in the dispensing head 100 forcing solder paste from the dispensing slot of the dispensing head 100 through apertures in the stencil 16 and onto the circuit board 26. Once the dispensing head 100 has fully traversed the stencil 16, the circuit board 26 is lowered back onto the conveyor rails 24 and transported from the printer 10 so that a second circuit board 26 may be loaded into the printer. To print on the second circuit board, the dispensing head 100 is moved across the stencil 16 in the direction opposite to that used for the first circuit board. Alternatively, a squeegee arm (as described below) could swing in to contain the solder paste in the dispenser, and the dispensing head can then be lifted in the z-direction and moved back to its original position to prepare to print on the second circuit board using a similar directional stroke.

Figure 2:
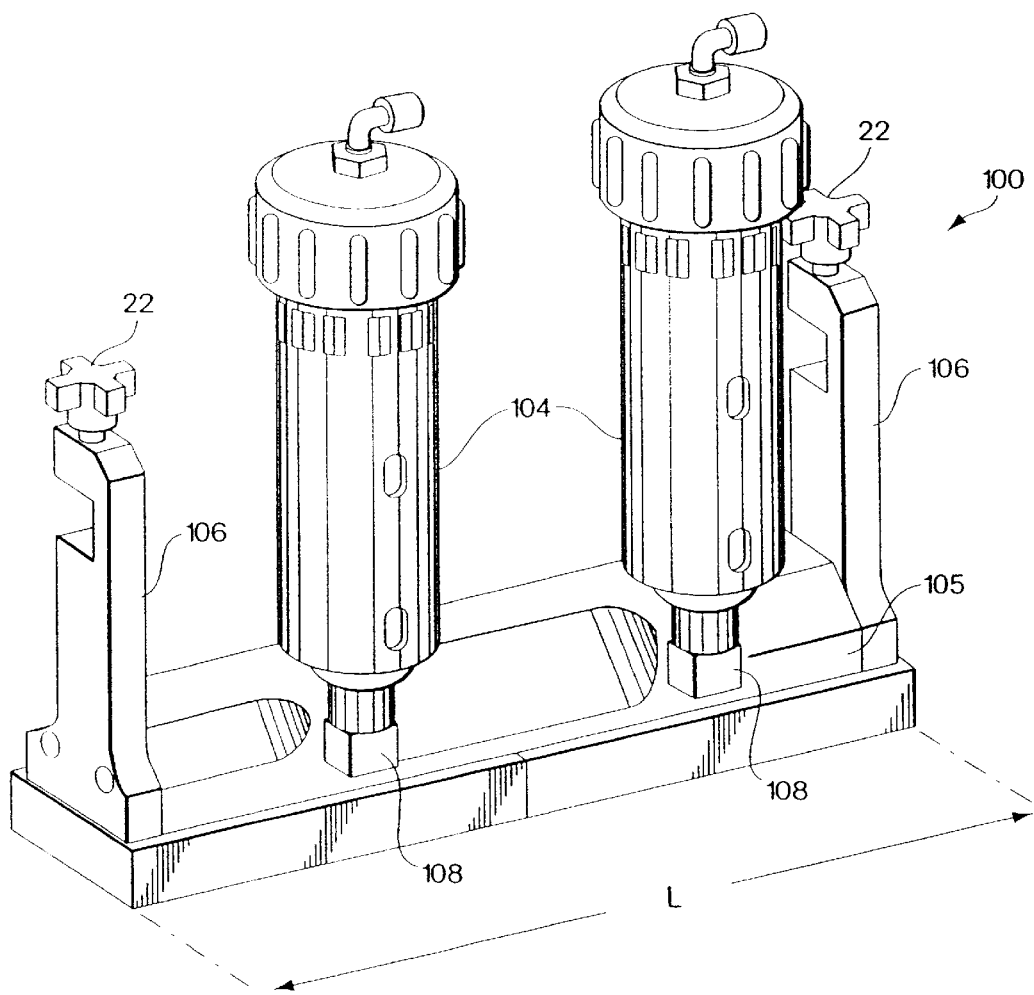
FIG. 2 provides a perspective view of a viscous-material dispensing head used in the stencil printer of FIG. 1.

As is further shown in FIG. 2, the dispensing head 100 includes a housing 105 coupled to two supporting arms 106. At one end of each of the supporting arms 106 are thumbscrews 22 that provide for easy removal and installation of the dispensing head 100. The housing 105 has two source ports 108 that are adapted to receive a standard SEMCO solder paste cartridge. Other removable cartridges may be used in place of the SEMCO cartridges. However, it is desirable to use a standard replaceable cartridge.

In the illustrated embodiment, the dispensing head 100 is adapted to receive two cartridges 104; however, the dispensing head 100 may be adapted to include more or fewer cartridges 104 than the two shown herein. The number of cartridges 104 used is selected based on the length L of the dispensing head 100 and the capacity of the cartridge 104 used. The length L is determined in part based on the width of the circuit boards to be printed upon. If the size of the circuit board changes, then the dispensing head may be replaced by a new dispensing head having a length L sized for the new circuit boards. The effective length of the dispensing slot 102, shown in FIG. 3, may also be reduced to accommodate smaller circuit boards by partially covering a portion of the slot 102.

Figure 3:
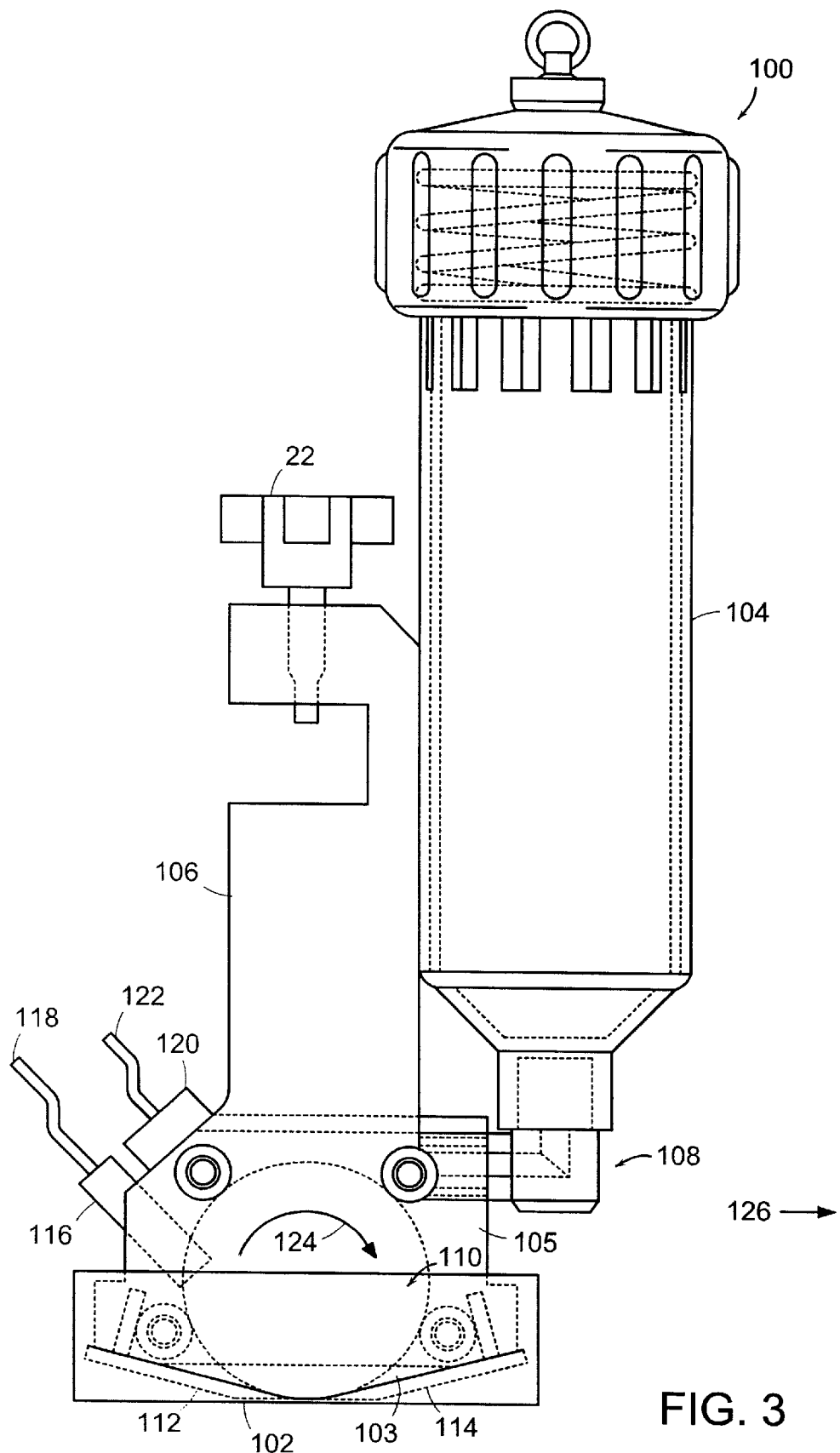
FIG. 3 provides a side view of the viscous-material dispensing head shown in FIG. 2; the stirring mechanism is not illustrated in FIG. 3.

As is further illustrated in FIG. 3, the housing 105 includes a chamber 110 in which solder paste received from the cartridge 104s is stored prior to being dispensed onto the stencil. The chamber 110 typically is cylindrical, though other geometries in which the stirring mechanism can be mounted and operated can also be used.

At the dispensing slot 102, the housing has two inwardly facing blades 112,114. Each of the inwardly facing blades 112, 114 has a length approximately equal to the length L of the slot 102, a width equal to approximately 0.138 inches, and a thickness of approximately 0.004 to 0.010 inches. Each of the blades 112 and 114, in one embodiment of the present invention, is made from spring steel. At each end of the blades 112, 114 is a side dam 103. While other materials, such as plastic, could be used to make the blades 112, 114, the use of spring steel provides long life with continued resiliency. Each of the blades 112, 114 is arranged to provide an angle of approximately 15 degrees between the blade and the top surface of the stencil. Depending in part on the material used to make the blades and the speed at which the material dispenser traverses the stencil, the blades can be oriented at angles other than 15 degrees.

The dispensing head 100, in one embodiment, further includes a pressure sensor 116 and a temperature controller 120. Incorporated within the temperature controller 120 is a thermoelectric device and a temperature sensor. The pressure sensor 116 and the temperature controller 120 are coupled to the controller 14 through cables 118 and 122 respectively. The controller 14 is configured to measure the pressure and the temperature of the solder paste within the chamber 110 based on signals received from the sensors, and the controller 14 controls the pressure and temperature by adjusting the force applied to the solder paste in the cartridges 104 and by controlling the thermoelectric device contained in the temperature controller 120. In one embodiment, the pressure of the solder paste is maintained in the chamber 110 by applying pressurized air at approximately 3–15 pounds per square inch to each of the cartridges 104. The temperature of the solder paste in the chamber 110 is maintained during the printing operation at approximately 68 degrees Fahrenheit. In one embodiment, the pressure sensor 116 is implemented using a pressure transducer with a programmable regulator and the temperature controller 120 is implemented using a temperature probe with a thermoelectric device that can provide cooling as well as heating of the solder paste.

As discussed above, when the dispensing head 100 is in the lowered printing position so that it is in contact with the stencil, the stencil printer 10 operates by forcing solder paste from the dispensing head 100 onto the stencil using air pressure applied to each of the cartridges 104 as the dispensing head 100 moves across the stencil. In the printing position, the blades 112 and 114 contact the top surface of the stencil. For each direction that the dispensing head 100 moves across the stencil, one of the blades 112 and 114 will be a trailing blade and will scrape any excess solder paste off the stencil. For example, when the dispensing head 100 moves in the direction of arrow 126 in FIG. 3, blade 112 will be a trailing blade removing any excess solder paste from the stencil.

Figure 4:
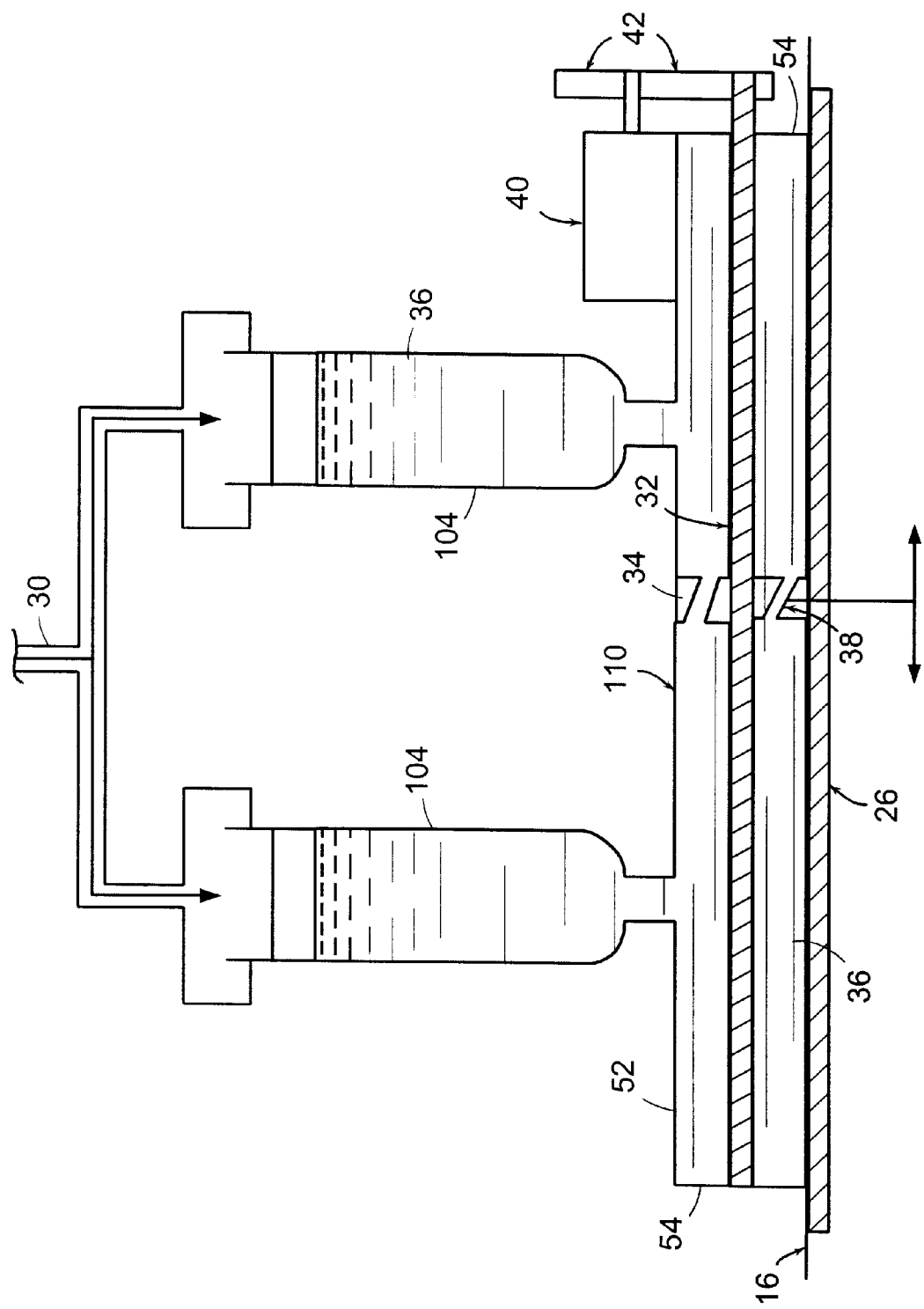
FIG. 4 offers a sectional view of a viscous-material dispensing head illustrating one embodiment of a stirring mechanism of this invention.

In the embodiments of the dispensing head, described above, the inventors have found that solder paste within the chamber 110 can be compacted without active stirring. Active stirring is provided in printers of this invention via a stirring mechanism mounted within the chamber. In one embodiment, illustrated in FIGS. 4 and 5, a stirring mechanism is provided in the form of a stirring blade 34 mounted on a threaded shaft 32. The threaded shaft 32 extends along the longitudinal axis of the chamber 110 defined by side walls 52 and end walls 54, and the stirring blade 34 is designed with inverse threads along the surface of its core, where it is mounted on the threaded shaft 32, such that rotation of the threaded shaft 32 will displace the stirring blade 34 along the longitudinal axis of the chamber 110. As the stirring blade 34 traverses the length of the chamber's longitudinal axis, solder paste 36 within the chamber 110 is forced through apertures 38 in the stirring blade 34, thereby stirring the solder paste 36 before it is discharged from the chamber through the dispensing slot.

The threaded shaft 32 is rotated using a rotary motor 40, such as a model number 3042w024cr motor from MicroMo Electronics, Inc. (Clearwater, Fla., USA), coupled with a drive train including gears 42 to communicate the rotary drive to the shaft 32. At opposite ends, the threaded shaft 32 is mounted to bearing retainers, which support the shaft 32 without inhibiting rotation. In one embodiment, the motor 40 has an output torque of 224 oz.in. (16 kg.cm), and the threaded shaft 32 has a pitch of 12 threads per inch (4.7 threads per cm). The stirring blade 34 can have a thickness of about 0.38 inches (1 cm), with 9 holes (full and partial) in the blade; the diameter of each of the holes is about 0.203 inches (0.52 cm). Both the threaded shaft 32 and stirring blade 34 are formed of steel.

Figure 7:
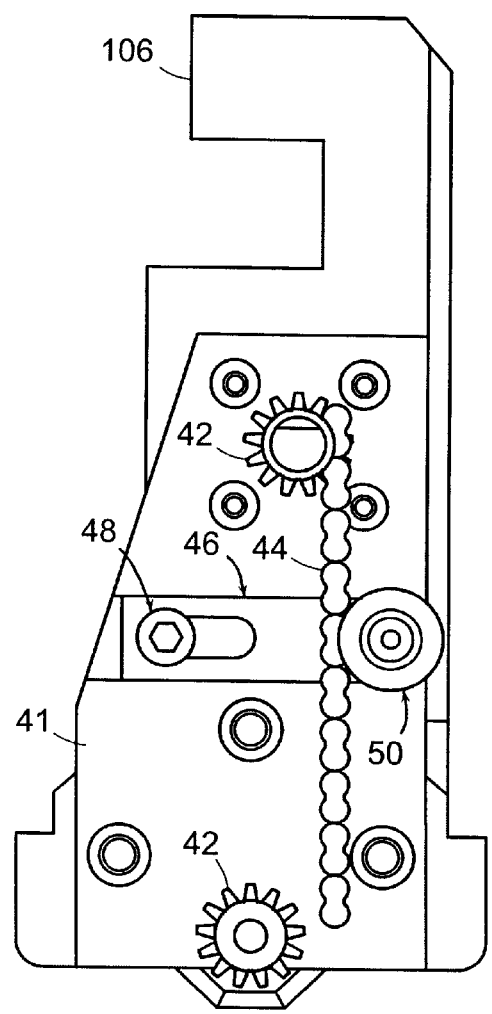
FIG. 7 is a side view of the viscous-material dispensing head illustrated in FIG. 5, particularly illustrating an embodiment of the drive mechanism.

A side view of the drive mechanism of the viscous-material dispensing head is illustrated in FIG. 7. As shown in FIG. 7, a chain 44 is mounted on the gears 42, which are mounted on a mount 41. A tensioner 46 includes an idler wheel 50 that contacts the chain 44 and is mounted to the mount 41 via a screw 48.

In one embodiment, the stirring mechanism (or stirrer) is displaced at a rate of about 4 mm/s. Though, the rate of displacement in other embodiments can range from about 1 to about 5 mm/s. The stirrer travels about 3 mm at the end of each print cycle when the dispensing head clears the printed board. Accordingly, the stirrer can complete a traverse across the length of the chamber after about 200 prints. The stirrer remains substantially stationary during the print cycle so as not to upset the pressure distribution within the chamber during printing. The speed and displacement of the stirring mechanism between prints can be varied, via commands from the controller to the motor, as long as no cavitation occurs at the paste/stirrer interface. Each "print" or "print cycle" is defined as a single pass of the dispensing head across the printed board. The number of prints for each cycle of the stirrer across the chamber can be set at the approximate number of prints after which compaction would occur in the particular solder paste being printed if active stirring was not employed. With the active stirring described herein, a solder paste that would compact after about 200 prints can be used for 1,000 to 5,000 prints without compaction.

Figure 5:
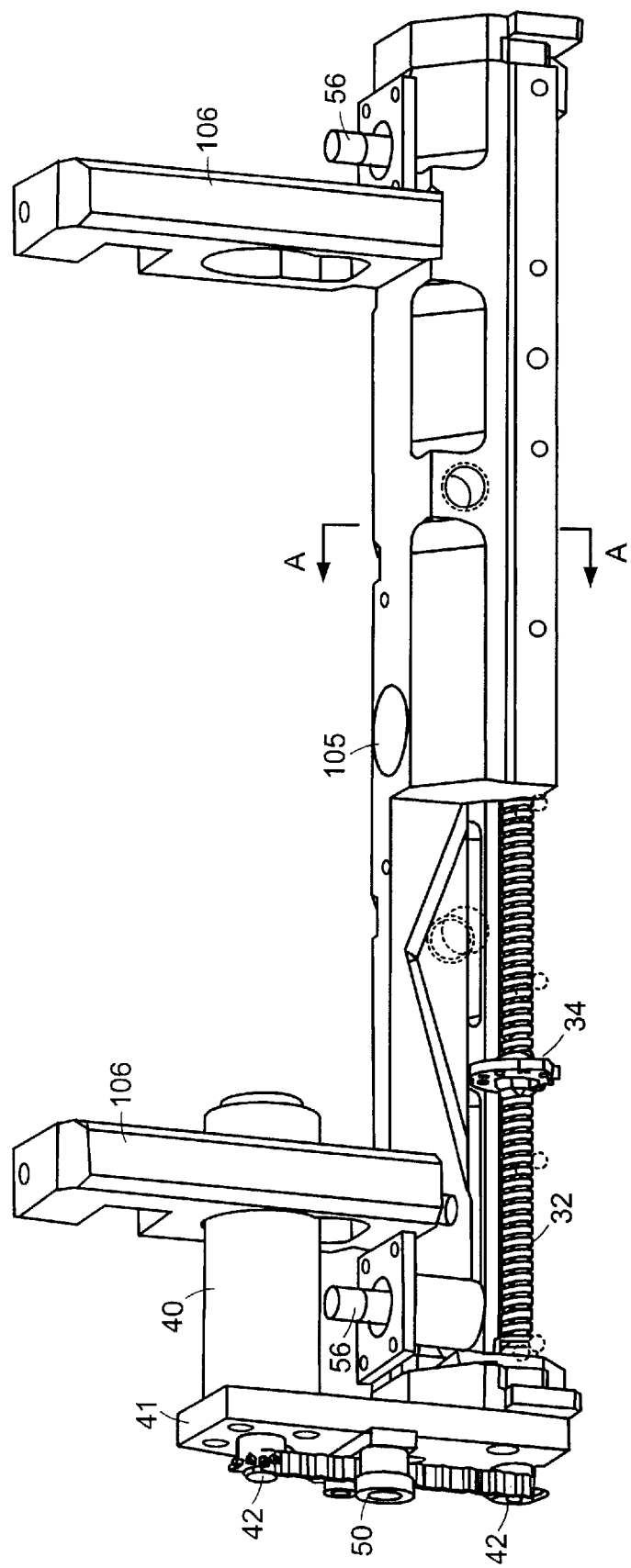
FIG. 5 is a partially-cut-away perspective view of a viscous-material dispensing head incorporating an embodiment of a stirring mechanism.
Figure 6:
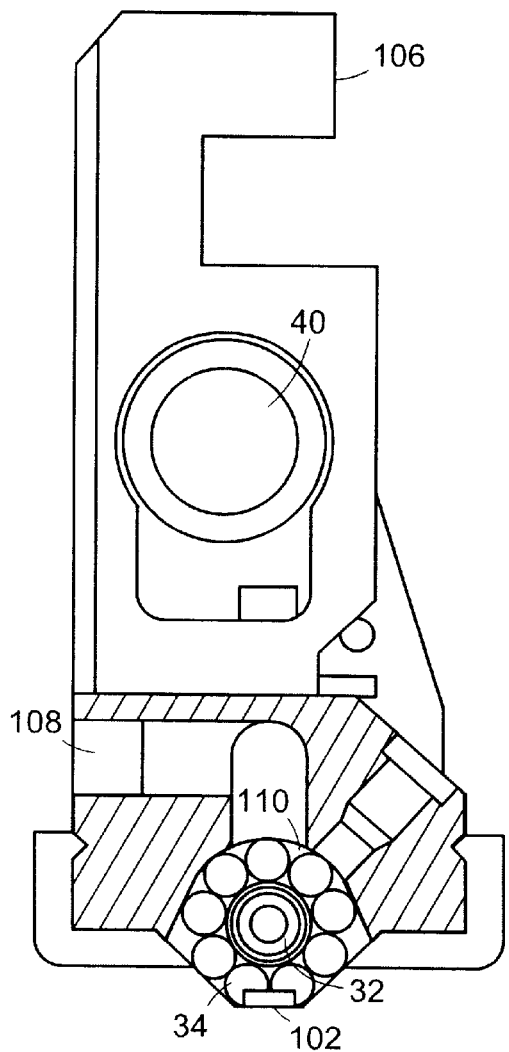
FIG. 6 is a sectional side view of the viscous-material dispensing head of FIG. 5, taken at section A—A in FIG. 5.

As shown in FIG. 5, a pair of limit sensors 56, such as model number 2400-1050-100 sensors from Reed Switch Developments Company (Racine, Wis., USA), are provided at opposite ends of the chamber to detect when the stirring blade has reached the end of its pass across the chamber. When either limit sensor 56 detects the stirring blade 34, the sensor 56 sends a signal to the controller, which in turn, issues a command to the motor 40 to stop and reverse its drive to send the stirring blade 34 back across the chamber in the opposite direction.

As an alternative to the stirring mechanism, described above, a variety of other stirring mechanisms can also be used in accordance with this invention. For example, a rotating blade or auger can be used as the stirring mechanism in place of the stirring blade/threaded shaft combination described above. Where a rotating blade or auger is used, the stirring mechanism (i.e., the blade) rotates through the chamber in a substantially circular path about the longitudinal axis of the chamber. In any case, the stirring mechanism is displaced through all or substantially all of the chamber where the viscous material is contained. Moreover, any other mechanism that would produce mixing of the of the viscous material in the chamber, via the mechanism's displacement through the chamber, can also be used.

The displacement of the stirring mechanism through the chamber in printers of this invention distinguishes these printers from those described, for example, in U.S. Pat. No. 5,925,187. This patent describes the use of a rotatable member in the form of a cylinder, which is rotated, in place, about its axis in an attempt to form a pressure gradient within the chamber to cause solder paste to be delivered through a dispensing slot at a controlled pressure. In contrast to the methods of this invention, however, U.S. Pat. No. 5,925,187 does not disclose or suggest displacing the cylinder through the chamber to stir the solder paste.

EXEMPLIFICATION

The chamber of a 14-inch (36-cm) model AP stencil printer from MPM (Franklin, Mass., USA) was fitted with the stirring mechanism illustrated in FIG. 5. The printer was operated with RA 390DH4 solder paste from Alpha Metals (Jersey City, N.J., USA).

When operated without the stirring mechanism, tests showed compaction of the solder paste within 170 prints, as measured by viewing the printing process in real time with a high-speed camera. When the printer was operated with the stirring mechanism in place and in operation, no compaction was found in the solder paste past 2,000 prints.

While this invention has been shown and described with references to particular embodiments thereof, those skilled in the art will understand that various changes in form and details may be made therein without departing from the scope of the invention, which is limited only by the following claims.

What is claimed is:

1. A printer for dispensing solder paste at predetermined positions on a printed circuit board, the printer comprising:
    a frame;
    a source of solder paste;
    a solder-paste dispensing head mounted to the frame, the dispensing head defining a chamber that has a longitudinal axis, the dispensing head also having at least one source port to which the source of solder paste is coupled so as to supply solder paste into the chamber, the solder-paste dispensing head also having a dispensing slot through which solder paste can exit the chamber and be deposited onto a printed circuit board;
    a stencil mounted to the frame and positioned to receive solder paste exiting from the dispensing slot of the chamber;
    a support apparatus coupled to the frame, the support apparatus positioned to place a printed circuit board mounted thereon in a position to receive solder paste that passes through the stencil;
    a stirring mechanism mounted within the chamber and extending through substantially all of the cross-section of the chamber perpendicular to the longitudinal axis of the chamber; and
    a drive mechanism coupled with the stirring mechanism for reciprocal displacement of the stirring mechanism through the chamber along the longitudinal axis of the chamber.

2. The printer of claim 1, wherein the dispensing slot is elongated about an axis parallel to the longitudinal axis of the chamber.

3. The printer of claim 1, wherein the chamber includes remote end walls intersecting the longitudinal axis of the chamber and at least one side wall radially positioned about the longitudinal axis and extending between the end walls, the source port and the dispensing slot both positioned on the side wall.

4. The printer of claim 1, further comprising a threaded shaft coupled with the drive mechanism, wherein the stirring mechanism is mounted on the threaded shaft so as to be displaced along the longitudinal axis as the drive mechanism rotates the shaft.

5. A printer for dispensing solder paste at predetermined positions on a printed circuit board, the printer comprising:
    a frame;
    a source of solder paste;
    a solder-paste dispensing head mounted to the frame, the dispensing head defining a chamber that has a longitudinal axis, the dispensing head also having at least one source port to which the source of solder paste is coupled so as to supply solder paste into the chamber, the solder-paste dispensing head also having a dispensing slot through which solder paste can exit the chamber and be deposited onto a printed circuit board;
    a stencil mounted to the frame and positioned to receive solder paste exiting from the dispensing slot of the chamber;
    a support apparatus coupled to the frame, the support apparatus positioned to place a printed circuit board mounted thereon in a position to receive solder paste that passes through the stencil;
    a stirring mechanism mounted within the chamber, wherein the stirring mechanism includes a stirring blade defining at least one aperture through which the solder paste can flow as the stirring mechanism is displaced along the longitudinal axis of the chamber; and
    a drive mechanism coupled with the stirring mechanism for displacement of the stirring mechanism through the chamber.

6. A printer for dispensing a viscous material at predetermined positions on a substrate, the printer comprising:
    a viscous-material dispensing head defining a chamber having a longitudinal axis, the dispensing head also having at least one source port to which a viscous-material source can be coupled so as to supply viscous material into the chamber, the viscous material dispensing head also having a dispensing slot through which viscous material can exit the chamber and be deposited onto a substrate;

a stirring mechanism mounted within the chamber and extending through substantially all of the cross-section of the chamber perpendicular to the longitudinal axis of the chamber; and a drive mechanism coupled with the stirring mechanism for reciprocal displacement of the stirring mechanism through the chamber along the longitudinal axis of the chamber.

7. The printer of claim 6, wherein the stirring mechanism is mounted on a threaded shaft so as to be displaced along the longitudinal axis with shaft rotation.

8. The printer of claim 6, wherein the dispensing slot is elongated about an axis parallel to the longitudinal axis of the chamber.

9. The printer of claim 6, further comprising at least one cartridge coupled with the source port, wherein the cartridge is filled with viscous material.

10. The printer of claim 9, wherein the viscous material is solder paste.

11. The printer of claim 9, wherein the cartridge includes an inlet, and a pressurized air source is coupled with the inlet to drive the viscous material from the cartridge into the chamber.

12. The printer of claim 9, further comprising:

a frame to which the dispensing head is mounted; and a support apparatus for supporting a substrate on which the viscous material is to be deposited, the support apparatus coupled with the frame and positioned to receive viscous material from the dispensing head.

13. The printer of claim 12, further comprising a stencil positioned to receive viscous material from the dispensing head and to selectively deposit the viscous material onto a substrate.

14. The printer of claim 13, wherein the chamber includes remote end walls on the longitudinal axis of the chamber and a side wall radially positioned about the longitudinal axis and extending between the end walls, the source port and the dispensing slot both positioned on the side wall.

15. The printer of claim 6, further comprising a heater positioned to supply heat within the chamber.

16. A printer for dispensing a viscous material at predetermined positions on a substrate, the printer comprising:

a viscous-material dispensing head defining a chamber having a longitudinal axis, the dispensing head also having at least one source port to which a viscous-material source can be coupled so as to supply viscous material into the chamber, the viscous material dispensing head also having a dispensing slot through which viscous material can exit the chamber and be deposited onto a substrate;

a stirring mechanism mounted within the chamber, wherein the stirring mechanism includes a stirring blade defining at least one aperture through which the viscous material can flow as the stirring mechanism is displaced along the longitudinal axis of the chamber; and a drive mechanism coupled with the stirring mechanism for displacement of the stirring mechanism through the chamber.

17. A method for printing solder paste comprising the steps of:

supplying solder paste to a chamber of a dispensing head;

providing a stirring mechanism mounted within the chamber and extending through substantially all of the cross-section of the chamber perpendicular to a longitudinal axis of the chamber;

providing a drive force to the stirring mechanism to reciprocally displace the stirring mechanism through the chamber along the longitudinal axis of the chamber, the stirring mechanism displacing solder paste substantially throughout the chamber as the stirring mechanism is displaced; and discharging the solder paste from the chamber onto a substrate.

18. The method of claim 17, wherein the solder paste is printed from the dispensing head in repeated printed cycles, and wherein the stirring mechanism is displaced between print cycles.

19. The method of claim 18, wherein the stirring mechanism remains substantially stationary during each print cycle.

20. The method of claim 17, further comprising passing the solder paste through a stencil as the solder paste is discharged from the chamber for selective deposition on the substrate.

21. The method of claim 20, wherein the substrate is a printed circuit board.

22. The method of claim 17, wherein the stirring mechanism includes a stirring blade that is reciprocally displaced along the longitudinal axis of the chamber.

23. The method of claim 22, wherein the stirring blade is displaced via rotation of a threaded shaft on which the stirring blade is displaceably mounted.

24. A method for printing solder paste comprising the steps of:

supplying solder paste to a chamber of a dispensing head;

providing a drive force to reciprocally displace a stirring blade through the chamber along a longitudinal axis of the chamber, forcing solder paste through apertures in the stirring blade; and discharging the solder paste from the chamber onto a substrate.

* * * * *